US010039203B2

(12) United States Patent
Cooney et al.

(10) Patent No.: US 10,039,203 B2
(45) Date of Patent: Jul. 31, 2018

(54) MOLDED CARD GUIDE CHASSIS

(71) Applicant: Hamilton Sundstrand Corporation, Charlotte, NC (US)

(72) Inventors: Robert C. Cooney, Janesville, IL (US); Jitendra J. Solanki, Belvidere, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/207,728

(22) Filed: Jul. 12, 2016

(65) Prior Publication Data

US 2018/0020568 A1 Jan. 18, 2018

(51) Int. Cl.
*H05K 7/14* (2006.01)

(52) U.S. Cl.
CPC .................................. *H05K 7/1418* (2013.01)

(58) Field of Classification Search
CPC .......................................... H05K 7/14–7/1424
See application file for complete search history.

(56) References Cited

U.S. PATENT DOCUMENTS 4,019,099 A 4/1977 Calabro
4,849,858 A * 7/1989 Grapes ................. H05K 1/0203 165/185
5,520,976 A * 5/1996 Giannetti ............. H05K 7/1418 174/384
5,700,342 A 12/1997 Giannetti
5,808,866 A 9/1998 Porter
5,827,585 A 10/1998 Giannetti et al.
6,520,608 B1 2/2003 Nelson et al.
7,869,216 B2 1/2011 Stevenson et al.
7,911,796 B2 3/2011 Vander Ploeg et al.
8,023,267 B2 9/2011 Streyle et al.
8,059,409 B2 11/2011 Steenwyk et al.
8,222,541 B2 7/2012 Vander Ploeg et al.
8,477,498 B2 * 7/2013 Porreca ................ H05K 7/1404 361/696
9,333,599 B2 5/2016 De Bock et al.
2007/0070601 A1 * 3/2007 Vos .................... H05K 7/20563 361/694
2007/0093092 A1 4/2007 Fang
2014/0347831 A1 * 11/2014 Snider .................. H05K 9/0045 361/752
2016/0374222 A1 * 12/2016 Trout ................... H05K 7/1418

FOREIGN PATENT DOCUMENTS

WO 2010138824 A2 12/2010

OTHER PUBLICATIONS

EP Search Report dated Nov. 28, 2017, EP application No. 17180868.6, 9 pages.

* cited by examiner

*Primary Examiner* — Hoa C Nguyen
(74) *Attorney, Agent, or Firm* — Cantor Colburn LLP

(57) ABSTRACT

A chassis to receive a line replaceable module including a molded body formed from a composite material, a card guide integrally formed in the molded body to receive the line replaceable module, the card guide including a card guide wall integrally formed in the molded body and extending outwardly from the molded body, and a plurality of tolerance features disposed within the card guide to retain the line replaceable module.

7 Claims, 5 Drawing Sheets

210
240
242
232
212
230

MOLDED CARD GUIDE CHASSIS

BACKGROUND

The subject matter disclosed herein relates to card guides, and more particularly, to molded card guide chassis for aircraft.

Line replaceable modules can be utilized within an aircraft to simplify replacement and upgrade of electrical components. Line replaceable modules can be installed in card guide chassis to align and electrically and mechanically connect the line replaceable modules. Often card guide chassis are formed from numerous parts, requiring complex, timely, and costly assembly.

BRIEF SUMMARY

According to an embodiment, a chassis to receive a line replaceable module including a molded body formed from a composite material, a card guide integrally formed in the molded body to receive the line replaceable module, the card guide including a card guide wall integrally formed in the molded body and extending outwardly from the molded body, and a plurality of tolerance features disposed within the card guide to retain the line replaceable module.

Technical function of the embodiments described above includes a molded body formed from a composite material, a card guide integrally formed in the molded body to receive the line replaceable module, the card guide including a card guide wall integrally formed in the molded body and extending outwardly from the molded body, and a plurality of tolerance features disposed within the card guide to retain the line replaceable module.

Other aspects, features, and techniques of the embodiments will become more apparent from the following description taken in conjunction with the drawings.

BRIEF DESCRIPTION OF THE DRAWINGS

The subject matter is particularly pointed out and distinctly claimed in the claims at the conclusion of the specification. The foregoing and other features, and advantages of the embodiments are apparent from the following detailed description taken in conjunction with the accompanying drawings in which like elements are numbered alike in the FIGURES:

DETAILED DESCRIPTION

Figure 1A:
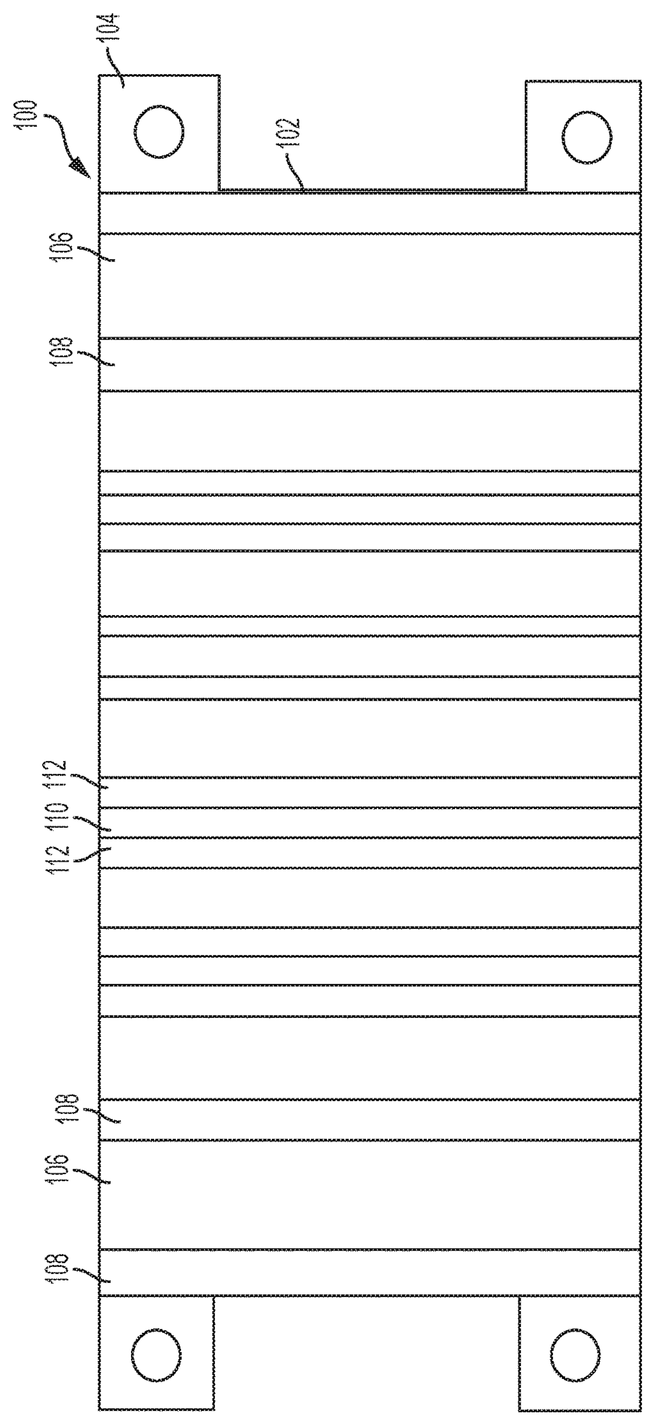
FIG. 1A is a schematic top view of one embodiment of a card guide chassis.
Figure 1B:
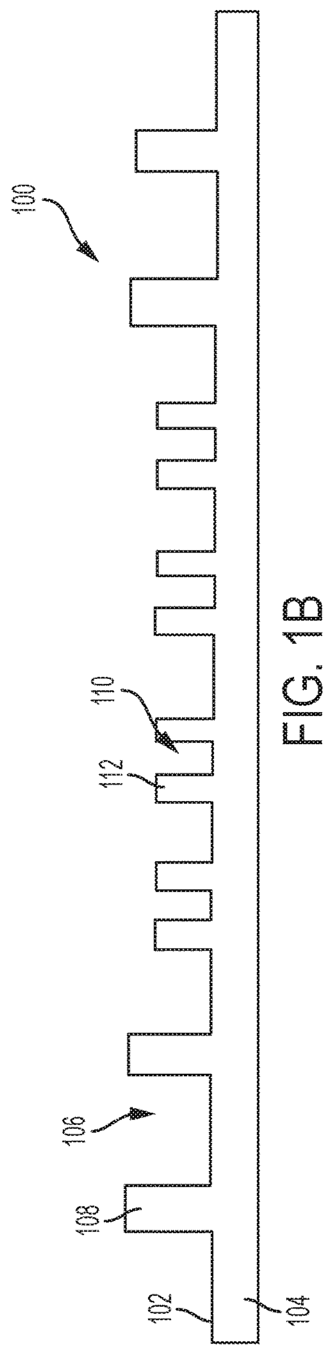
FIG. 1B is an elevation view of the card guide chassis of FIG. 1A.

Referring to the drawings, FIGS. 1A and 1B shows a card guide chassis 100. In the illustrated embodiment, the card guide chassis 100 includes a chassis body 102 with molded card guides 110 integrally formed therein. In the illustrated embodiment, the card guide chassis 100 can guide and retain line replaceable modules while providing vibration dampening for the sensitive electronic components. Advantageously, the card guide chassis 100 is formed from a molded construction to allow for manufacturing repeatability and lower labor costs.

In the illustrated embodiment, that chassis body 102 is an integrally molded body. In the illustrated embodiment, the chassis body 102 is formed using any suitable molding method. Advantageously, molding the chassis body 102 improves production quality and reliability by lowering total part count. Further, tolerances required for the line replaceable modules can be maintained with lower effort. Further, molding operations allow for reduced variability and greater shear strength.

In the illustrated embodiment, the chassis body 102 is molded from a composite material, including, but not limited to a glass fiber composite. Advantageously, the use of composite materials prevents the formation of corrosion on the chassis body 102. Further, the use of composite materials provides inherent vibration dampening, improving the performance of the card guide chassis 100 in harsh vibration environments. Further, the use of composite materials reduces exposure to hazardous chemicals such as hexavalent chromium.

In certain embodiments, the composite material can include conductive materials, including, but not limited to aluminum. In certain embodiments, the composite material can include conductive materials in the form of mesh and/or fiber. Advantageously, conductive materials within the chassis body 102 can provide a conductive ground path to provide a chassis ground reference. The ground path provides a safety ground and a reference for filtering/shielding components.

In the illustrated embodiment, the chassis body 102 can include bolt hole flanges 104. The bolt hole flanges 104 can allow for the chassis body 102 to be affixed in an electronic enclosure. Advantageously, the molded construction of the bolt hole flange 104 allows for vibration reduction. In certain embodiments, the bolt hole flanges 104 can allow for a ground path for the chassis body 102.

In the illustrated embodiment, the chassis body 102 includes a molded U channel 106. The molded U channel 106 includes U channel walls 108. In the illustrated embodiment, the molded U channel 106 is integrally formed with the chassis body 102. In the illustrated embodiment, the molded U channels 106 can accept line replacement modules with wedge lock locking mechanisms. Wedge lock locking mechanisms can act against the U channel walls 108.

In the illustrated embodiment, the chassis body 102 includes molded card guides 110. In the illustrated embodiment, the molded card guides 110 are formed by the card guide walls 112. In the illustrated embodiment, the molded card guides 110 are integrally formed with the chassis body 102. In the illustrated embodiment, the card guide walls 112 are spaced apart to allow a frictional fit of a line replaceable module. Advantageously, by molding the molded card guides 110 integral to the chassis body 102, no additional labor is required to assemble the card guides. Further, by reducing the part count of the card guide chassis 100, variability between multiple card guide chassis is reduced. Further, the shear strength of the chassis body 102 is improved compared to conventional chassis bodies.

Figure 2:
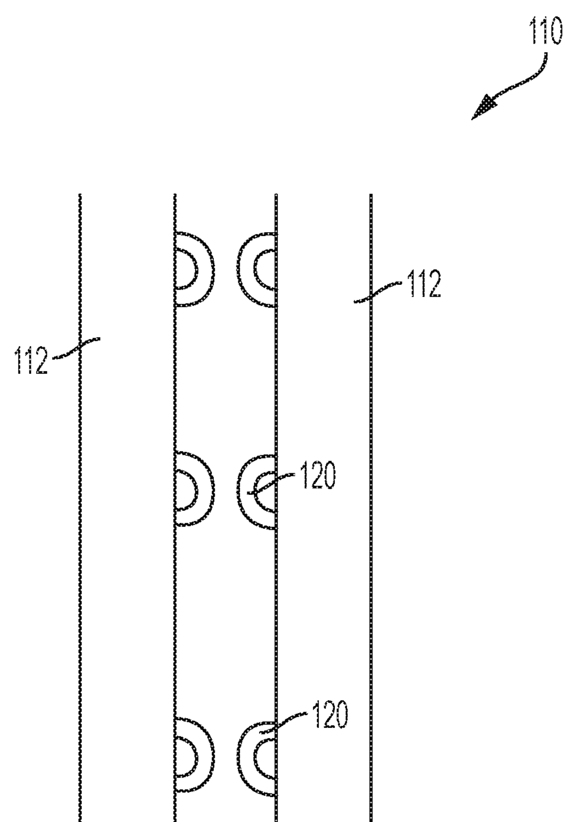
FIG. 2 is a detail view of a card guide of the card guide chassis of FIG. 1A.

Referring to FIG. 2, tolerance features 120 of the molded card guide 110 are shown. In the illustrated embodiment, the molded card guides 110 can provide a frictional fit to line replaceable modules by providing tolerance features 120 integrally formed along the card guide walls 112. Advantageously, tolerance features 120 can be utilized to provide a more secure frictional fit of line replaceable modules without requiring tight tolerances of the card guide wall 112 spacing. Tolerance features 120 can provide local areas of tight tolerances that can retain the line replaceable modules without excess interference or insertion force. In certain embodiments, tolerance features 120 can provide additional localized vibration dampening.

Figure 3:
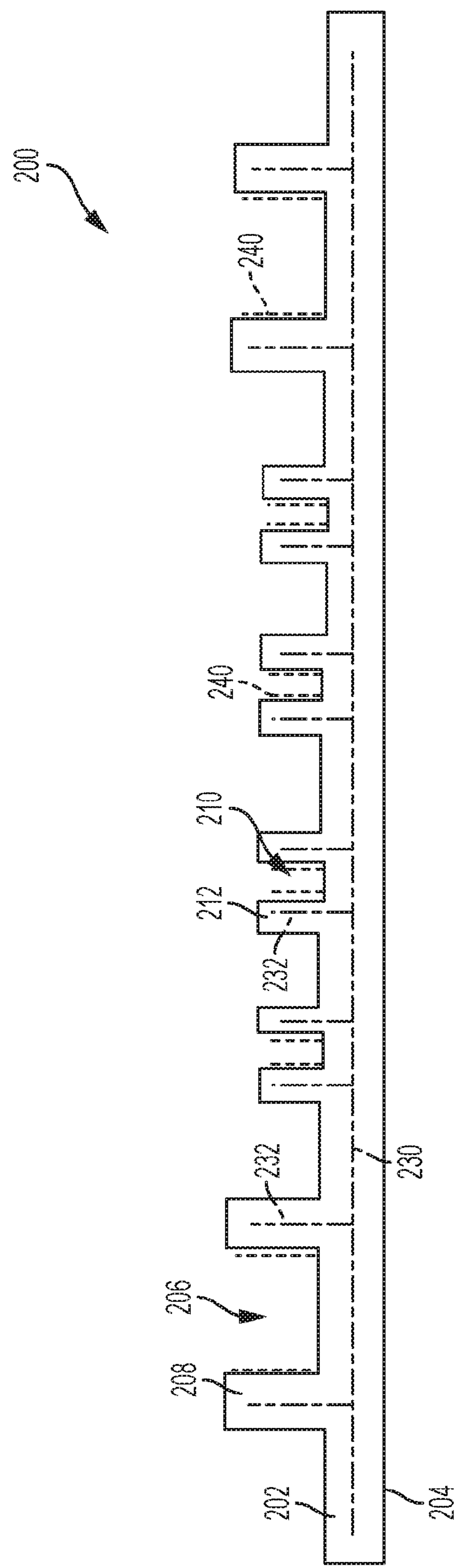
FIG. 3 is a schematic elevation view of another embodiment of a card guide chassis.

Referring to FIG. 3, a card guide chassis 200 is shown. In the illustrated embodiment, similar reference numerals refer to similar elements described herein. In the illustrated embodiment, the chassis body 202 further includes a conductive mesh 230 and conductive strips 240. Advantageously, the use of the conductive mesh 230 and the conductive strips 240 allow for greater conductivity between a ground and the line replaceable modules for desired operation.

In the illustrated embodiment, a conductive mesh 230 is disposed within the molded chassis body 202. In certain embodiments, the conductive mesh 230 is embedded into the chassis body 202 during the molding operation. In the illustrated embodiment, the conductive mesh 230 can extend into the card guide walls 212 with conductive mesh walls 232. In the illustrated embodiment, the conductive mesh 230 can extend into the U channel walls 208 with conductive mesh walls 232. The conductive mesh 230 can be formed from any suitable conductive mesh. In certain embodiments, the conductive mesh 230 can work in conjunction with the conductive composite of the chassis body 202. Advantageously, the use of the conductive mesh 230 allows for greater conductivity while minimizing secondary processing and environmental waste.

In the illustrated embodiment, conductive strips 240 can be pressed into the card guide walls 212. The conductive strips 240 can provide an enhanced conductive pathway between a line replaceable module and the card guide walls 212. The conductive strips 240 can be formed from any suitable conductive material.

Figure 4:
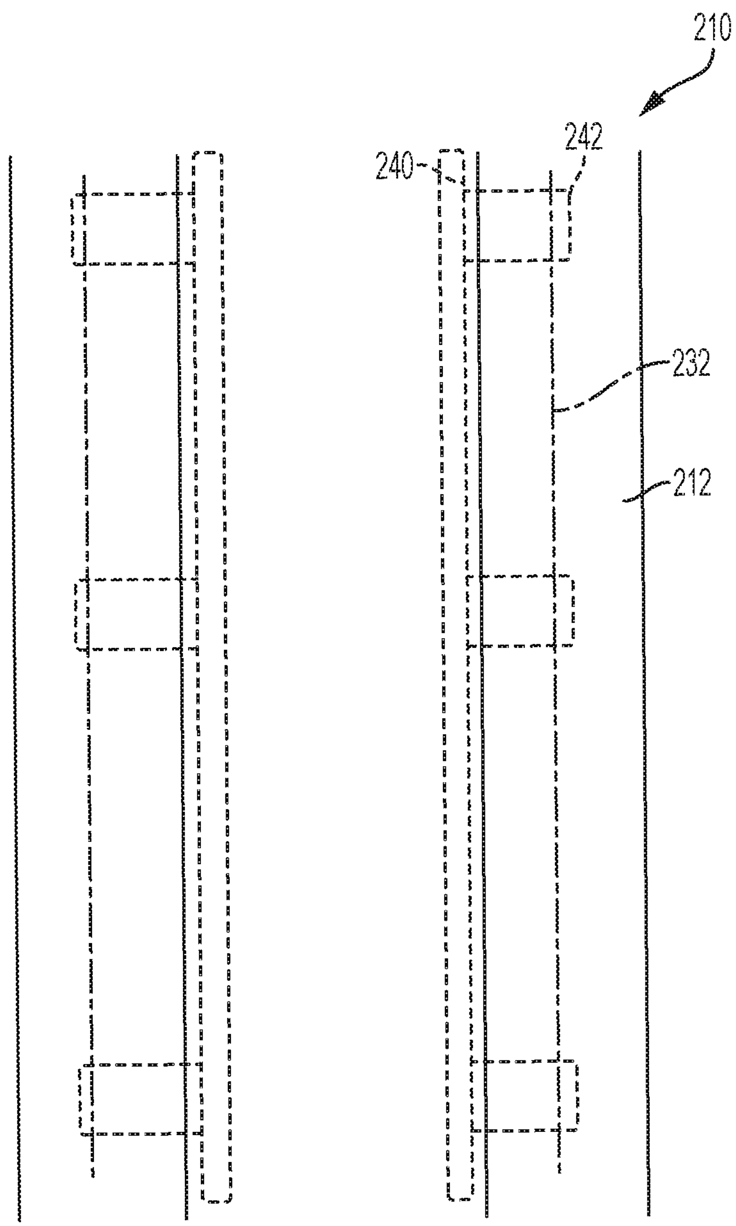
FIG. 4 is a detail top view of a card guide of the card guide chassis of FIG. 3.
Figure 5:
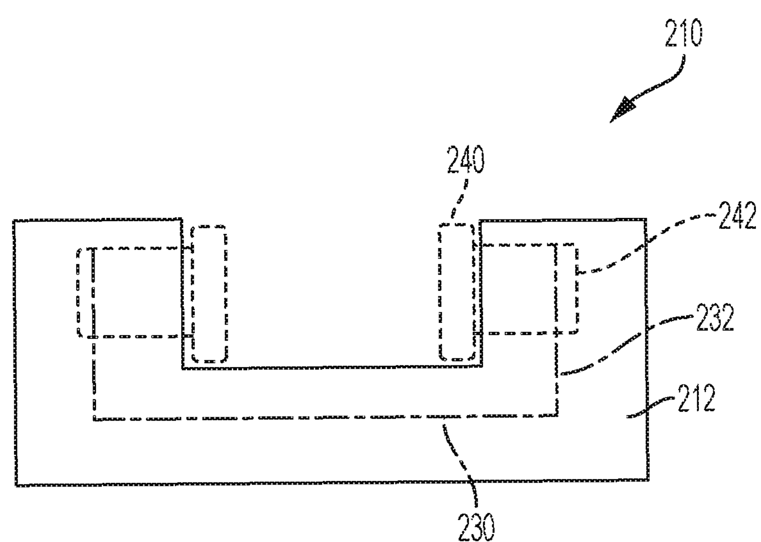
FIG. 5 is a detail elevation view of a card guide of the card guide chassis of FIG. 3.

In certain embodiments, the conductive strips 240 can provide an enhanced conductive pathway between a line replaceable module and the conductive mesh walls 232. Referring to FIGS. 4 and 5, conductive tabs 242 can extend from the conductive strips 240 to electrically attach the conductive strips 240 to the conductive mesh walls 232. In certain embodiments, the conductive tabs 242 can provide a frictional fit or a tolerance feature to retain a line replaceable module. In certain embodiments, the conductive tabs 242 can be utilized with the tolerance features 120 shown in FIG. 2. In certain embodiments, the conductive strips 240 can be electrically attached to the conductive mesh walls 232 prior to molding the chassis body 202. In certain embodiments, the conductive strips 240 can be electrically connected to the conductive mesh 230 and the conductive mesh walls 232 after the chassis body 202 is formed.

The terminology used herein is for the purpose of describing particular embodiments only and is not intended to be limiting of the embodiments. While the description of the present embodiments has been presented for purposes of illustration and description, it is not intended to be exhaustive or limited to the embodiments in the form disclosed. Many modifications, variations, alterations, substitutions or equivalent arrangement not hereto described will be apparent to those of ordinary skill in the art without departing from the scope and spirit of the embodiments. Additionally, while various embodiments have been described, it is to be understood that aspects may include only some of the described embodiments. Accordingly, the embodiments are not to be seen as limited by the foregoing description, but are only limited by the scope of the appended claims.

What is claimed is:

1. A chassis to receive a line replaceable module, the chassis comprising:

a molded body formed from a composite material;

a card guide integrally formed in the molded body to define an opening receptive of the line replaceable module, the card guide including card guide walls integrally formed in the molded body and extending outwardly from the molded body;

a plurality of tolerance features disposed in pairs on opposing faces of the card guide walls within the card guide to retain the line replaceable module between corresponding respective tolerance features of each of the pairs;

conductive mesh, which is embedded within an interior of the molded body and which extends along a length of the molded body;

conductive mesh walls respectively extending from the conductive mesh through the interior of the molded body toward an interior of and along a length of corresponding ones of the opposing card guide walls;

conductive strips respectively extending along the opposing faces of the corresponding ones of the card guide walls in the opening; and conductive tabs respectively extending from corresponding ones of the conductive mesh walls, through the opposing faces to the opening and the corresponding ones of the conductive strips.

2. The chassis of claim 1, wherein the card guide has a U channel shape.

3. The chassis of claim 1, wherein the plurality of tolerance features are disposed in the pairs on the opposing walls of the card guide such that tips of the corresponding respective tolerance features of each of the pairs contact opposite sides of the line replaceable module.

4. The chassis of claim 1, further comprising at least one bolt hole flange formed with the molded body.

5. The chassis of claim 1, wherein the composite material is electrically conductive.

6. The chassis of claim 1, wherein the molded body provides vibration dampening.

7. A chassis to receive a line replaceable module, the chassis comprising:

a U shaped card guide integrally formed in a molded body to define an opening receptive of the line replaceable module, the U shaped card guide including a first guide wall extending outwardly from a surface of the molded body and a second guide wall extending outwardly from the surface of the molded body, and the first and second guide walls having complementary faces facing one another in opposite directions;

a plurality of tolerance features disposed in pairs on the complementary faces of the first and second guide walls such that tips of corresponding respective tolerance features of each of the pairs contact opposite sides of the line replaceable module for retaining the line replaceable module in the U shaped card guide;

conductive mesh, which is embedded within an interior of the molded body and which extends along a length of the molded body;

conductive mesh walls respectively extending from the conductive mesh through the interior of the molded body toward an interior of and along a length of corresponding ones of the first and second card guide walls;

conductive strips respectively extending along the complementary faces of the corresponding ones of the first and second card guide walls in the opening; and conductive tabs respectively extending from corresponding ones of the conductive mesh walls, through the complementary faces to the opening and the corresponding ones of the conductive strips.

* * * * *